(12) United States Patent
Aki et al.

(10) Patent No.: US 6,784,513 B2
(45) Date of Patent: Aug. 31, 2004

(54) SEMICONDUCTOR LIGHT RECEIVING DEVICE AND ELECTRONIC APPARATUS INCORPORATING THE SAME

(75) Inventors: Motonari Aki, Nara (JP); Yoshiki Yasuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/421,866

(22) Filed: Apr. 24, 2003

(65) Prior Publication Data

US 2003/0201433 A1 Oct. 30, 2003

(30) Foreign Application Priority Data

Apr. 25, 2002 (JP) ........................................ 2002-125051

(51) Int. Cl.[7] .......................... H01L 31/06; H01L 21/00
(52) U.S. Cl. ...................... 257/462; 257/461; 257/463; 257/464; 257/465; 257/257; 257/258; 438/48; 438/87; 438/309
(58) Field of Search ................................ 257/257–258, 257/461–465, 20–21; 438/48, 87, 309

(56) References Cited

FOREIGN PATENT DOCUMENTS

| JP | 5-183186 A | 7/1993 |
| JP | 11-135824 | * 5/1999 |

\* cited by examiner

*Primary Examiner*—Donghee Kang
(74) *Attorney, Agent, or Firm*—Birch, Stewart, Kolasch & Birch, LLP

(57) ABSTRACT

A semiconductor light receiving device is provided, which comprises a semiconductor substrate, a collector region, a base region, and an emitter region, an insulating film covering the surface of the collector region, the base region, and the emitter region, a first metal line on the insulating film at a position corresponding to the base region and being electrically connected to the emitter region, and a second metal line on the insulating film at a position corresponding to a junction portion of the base region and the collector region and being electrically connected to the emitter region. The first metal line has a sloped surface such that incident light falling on the first metal line is reflected and directed toward the surface of the base region.

11 Claims, 6 Drawing Sheets

*Prior Art*

SEMICONDUCTOR LIGHT RECEIVING DEVICE AND ELECTRONIC APPARATUS INCORPORATING THE SAME

BACKGROUND OF THE INVENTION

1. Field of the Invention

The present invention relates to a semiconductor light receiving device, such as a phototransistor and the like, and an electronic apparatus incorporating the same. More particularly, the present invention relates to a semiconductor light receiving device used for a photocoupler, and an electronic apparatus incorporating the same.

2. Description of the Related Art

Phototransistors are used as switching elements, such as an optical switch and the like. The phototransistor performs a switching operation which is triggered by a photocurrent generated in a photodiode provided between a base electrode and a collector electrode. Such a photocurrent is generated by carries excited by light incident on a light receiving region.

When a phototransistor is incorporated in, for example, a photocoupler having a light emitting element, a stray capacitance Cf is caused between the phototransistor and a light emitting diode chip (light emitting diode is hereinafter abbreviated as LED) of the photocoupler. The base region of the phototransistor typically serves as a light receiving region. The surface of the base region is uncovered and exposed. Therefore, when a steeply changing pulse voltage is applied between the phototransistor and the LED of the photocoupler, a displacement current (noise current) caused by electromagnetic noise occurs in the base region of the phototransistor via the stray capacitance Cf, which may cause malfunctions of the phototransistor.

In general, the phototransistor comprises an N type collector layer serving as a collector (C), a P type base layer serving as a base (B), and an N type emitter layer serving as an emitter (E). Typically, even when a minute value of base current Ib is input to the P type base layer, a large value of collector current (output current) Ic=hfe×Ib (where hfe represents an amplification factor and Ib represents a base current) is output. Therefore, in order to prevent malfunctions of the phototransistor due to electromagnetic noise or the like, it is most important to suppress a noise current occurring in the P type base layer and its surrounding region.

As described above, when the phototransistor is incorporated in the photocoupler, a sharply changing, pulse-like displacement voltage occurs between the LED and the phototransistor in the photocoupler. In this case, the displacement voltage causes electromagnetic noise via a stray capacitance Cf therebetween, resulting in a noise current in the P type base layer of the phototransistor. In the case of the occurrence of such a noise current in the P type base layer, the N type collector layer of the phototransistor serving as a collector (C) outputs a collector current Ic represented by:

$$Ic = hfe \times Ib = hfe \times Cfb \times d(VCM)/dt \qquad (1)$$

where hfe is the amplification factor of the transistor, Ib represents a base current, Cfb represents a stray capacitance between the LED of the photocoupler and the P type base layer of the phototransistor, VCM represents a voltage between the LED of the photocoupler and the phototransistor, and t represents a time.

Thus, when a malfunction is caused in the phototransistor, a large value of collector current Ic is output from the phototransistor in accordance with the above-described expression (1), which may have an adverse influence on external circuitry.

In order to address malfunctions due to such electromagnetic noise or the like, phototransistors may be equipped with a common mode rejection (CMR) characteristic which is used as an indicator representing the performance of the phototransistor.

The CMR characteristic represents an ability to absorb noise as follows. With the CMR characteristic, a noise current, which is input to the phototransistor via a stray capacitance Cf, is caused to flow into the N type emitter layer of the transistor, but not the P type base layer region, when a steeply changing voltage (e.g., a noise signal) is applied between the LED and the phototransistor of the photocoupler. Since the N type emitter layer is designed so that a large current flows, a minute noise current caused by a noise signal can be caused to flow out of the phototransistor quickly. The reason the minute noise current is caused to flow into the N type emitter layer through which a large value of current flows, is that the current passing through the N type emitter layer is not substantially affected by the minute noise current.

Accordingly, in order to improve the CMR characteristic when the phototransistor is incorporated in the photocoupler, the light receiving region of the phototransistor needs to be provided with a metal line which is coupled to the N type emitter layer and thus has the same potential as that of the N type emitter layer.

FIG. 9 is a cross-sectional view showing a structure of a photocoupler incorporating a phototransistor in which malfunctions due to electromagnetic noise are suppressed.

A phototransistor 200 shown in FIG. 9 is configured so that a planer N type semiconductor substrate has an N+ type collector layer 22 and an N type collector layer 30 laminated on the N+ type collector layer 22. An N+ type channel stopper layer 130 is embedded at an outer periphery (along a surrounding edge) of the N type collector layer 30, where the N+ type channel stopper layer 130 is exposed from an outer peripheral surface of the N type collector layer 30. A P type base layer 40 having a predetermined thickness is embedded in a middle portion of the N type collector layer 30 surrounded by the N+type channel stopper layer 130, where there is a predetermined space between the P type base layer 40 and the N+type channel stopper layer 130 and the P type base layer 40 is exposed from a surface of the N type collector layer 30. A surface of the P type base layer 40 receives incident light. An N+ type emitter layer 50 having a predetermined thickness is embedded in the vicinity of an edge of the P type base layer 40, where the N+ type emitter layer 50 is exposed from a surface of the P type base layer 40.

An emitter underlying electrode 70 is provided on a middle portion of the N+ type emitter layer 50. An oxide insulating film 60 is provided around the emitter underlying electrode 70, where the oxide insulating film 60 covers surfaces of the N type collector layer 30, the P type base layer 40, the N+ type emitter layer 50, and the N+ type channel stopper layer 130. An emitter electrode 120 is provided on the emitter underlying electrode 70 and the oxide insulating film 60, where the emitter electrode 120 faces the N+ type emitter layer 50.

A metal guard ring line 90 is provided on the oxide insulating film 60 along each inner edge of regions in which the N+ type channel stopper layer 130 is embedded, where the metal guard ring line 90 is electrically connected to the emitter electrode 120. Further, a metal shield line 80 is provided on the oxide insulating film 60 covering the surface of the P type base layer 40, where the metal shield line 80 is electrically connected to the emitter electrode 120 (in FIG. 9, the connections between the emitter electrode 120, and the metal shield line 80 and the metal guard ring line 90 are not shown). A collector electrode 21 is provided on a surface of the N+ type collector layer 22.

The phototransistor 200 is thus provided with an NPN transistor comprising the N+ type collector layer 22 and the N type collector layer 30, the P type base layer 40, and the N+ type emitter layer 50, which serve as collectors (C), a base (B), and an emitter (E), respectively; and a photodiode having a PN junction at the interface between the P type base layer 40 and the N type collector layer 30 where the N+ type collector layer 22 and the N type collector layer 30 serve as cathodes and the P type base layer 40 serves as an anode.

Now it is assumed that the phototransistor 200 is disposed opposing a photocoupler in which a light emitting element 180, such as an LED or the like, is provided on a substrate 170 (a lead frame may be used instead of the substrate). In this case, electric lines of force 190 are generated directing from the emitter electrode 120 of the phototransistor 200, and the metal shield line 80 and the metal guard ring line 90, which are electrically connected to the emitter electrode 120 so that they have the same potential as that of the emitter electrode 120, to the light emitting element 180 of the photocoupler. The electric line of force 190 functions as a shield for protecting the P type base layer 40 from electromagnetic noise caused when a steeply changing pulse voltage is applied between the light emitting element 180 and the phototransistor 200. The electromagnetic noise causes noise currents in the emitter electrode 120, the metal shield line 80 and the metal guard ring line 90. However, the noise current is caused to flow out of the phototransistor 200 quickly.

Thus, the phototransistor 200 of FIG. 9 is provided with the metal shield line 80 having the same potential as that of the emitter electrode 120, which is located on the predetermined region of the P type base layer 40, and the metal guard ring line 90 having the same potential as that of the emitter electrode 120, which is located on the PN junction region between the P type base layer 40 and the N type collector layer 30. Therefore, it is possible to suppress the noise current which otherwise occurs in the P type base layer 40 (the base (B)) of the phototransistor 200 via a stray capacitance Cf between the light emitting element 180 of the photocoupler and the phototransistor 200.

Japanese Laid-Open Publication No. 5-183186 discloses a phototransistor in which a metal guard ring line made of Al is used so as to suppress a noise current due to electromagnetic noise. Japanese Laid-Open Publication No. 11-135824 discloses a photodiode in which metal shield lines 80 is arranged in mesh so as to suppress a noise current due to electromagnetic noise. In the photodiode disclosed in Japanese Laid-Open Publication No. 11-135824, the effect of absorbing electromagnetic noise is improved, however, as the pitch of the mesh is increased, the area occupied by the metal shield line 80 on the light receiving region is increased, resulting in a reduction in a substantive light receiving area and a reduction in the amount of received light. Thus, the output current of the photodiode is not sufficiently obtained.

In recent years, there is a demand for a higher performance and smaller size light receiving device, such as a phototransistor and the like, which requires the increase of the packing density of elements on a substrate. To achieve this, the phototransistor 200 has to secure a certain light receiving area to such an extent that a predetermined amount of light can be received on the light receiving region of the P type base layer 40.

The CMR characteristic of the phototransistor 200 may be improved by providing a number of metal shield lines 80 on the light receiving region on the P type base layer 40. In this case, whereas the CMR characteristic is improved, the increased number of metal shield lines 80 leads to a reduction in the effective light receiving area of the light receiving region of the phototransistor 200. Therefore, a predetermined amount of light cannot be received.

FIG. 10 is an enlarged, cross-sectional view the metal shield line 80 of the phototransistor 200 of FIG. 9 and its vicinity. As shown in FIG. 10, the metal shield line 80 is in the form of a plate having a rectangular section. Therefore, incident light 140 coming to the metal shield line 80 from above is substantially totally reflected as reflected light 150 vertically toward above since the top surface of the metal shield line 80 is horizontal. Thus, a very small amount of light (i.e., including almost only scattering components) enters the P type base layer 40 (light receiving region). As a result, if the number of metal shield lines 80 is increased in order to improve the CMR characteristic, the area shielded from the incident light 140 is increased in the light receiving region of the phototransistor 200. The light receiving area is thus decreased, so that a predetermined amount of received light may not be obtained.

Therefore, it is difficult to simultaneously achieve both an improved CMR characteristic (noise resistance) and a predetermined amount of received light in the phototransistor 200 of FIG. 9.

SUMMARY OF THE INVENTION

According to an aspect of the present invention, semiconductor light receiving device is provided, which comprises a semiconductor substrate, a collector region on the semiconductor substrate, a base region embedded in the collector region and exposed from a surface of the collector region, wherein the base region serves as a light receiving region, an emitter region embedded in the base region and exposed from a surface of the base region, an insulating film covering the surface of the collector region, the base region, and the emitter region, a first metal line on the insulating film at a position corresponding to the base region and being electrically connected to the emitter region, and a second metal line on the insulating film at a position corresponding to a junction portion of the base region and the collector region and being electrically connected to the emitter region. The first metal line has a sloped surface such that incident light falling on the first metal line is reflected and directed toward the surface of the base region.

In one embodiment of this invention, the sloped surface of the first metal line is sloped at an angle of more than 45° with respect to the surface of the base region.

In one embodiment of this invention, the first metal line and the second metal line are made of Al and Cu.

In one embodiment of this invention, the first metal line and the second metal line are made of Al and Ag.

In one embodiment of this invention, the sloped surface of the first metal line is covered with a protection film.

In one embodiment of this invention, the protection film is made of an oxide film.

In one embodiment of this invention, the protection film is made of a metal film.

In one embodiment of this invention, the metal film is made of Al.

In one embodiment of this invention, the emitter region and the base region each have an electrode portion having a laminate structure comprising an upper layer of Al and a lower layer of Cu.

In one embodiment of this invention, the first metal lines are arranged in mesh.

According to another aspect of the present invention, an electronic apparatus is provided, which comprises the above-described semiconductor light receiving device.

Thus, the invention described herein makes possible the advantages of providing a semiconductor light receiving device having an improved CMR characteristic without a reduction in the amount of received light; and an electronic apparatus incorporating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
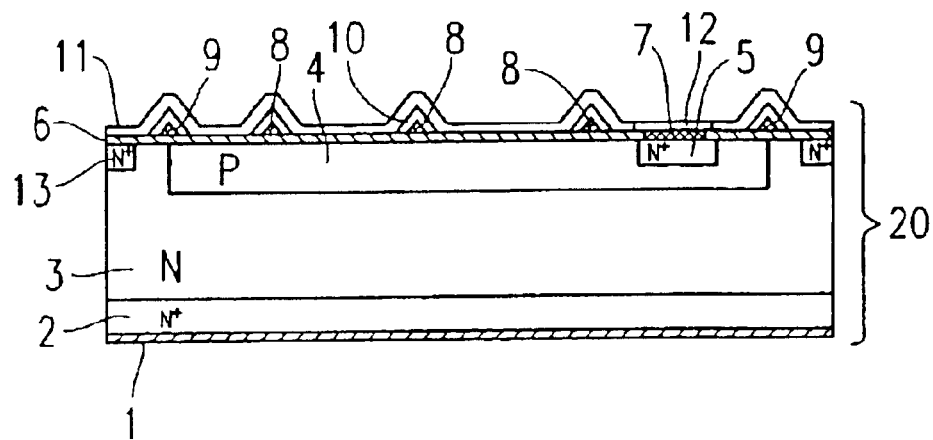
FIG. 1 is a cross-sectional view showing a structure of a phototransistor which is a semiconductor light receiving device according to an embodiment of the present invention.

FIG. 1 is a cross-sectional view showing a structure of a phototransistor which is a semiconductor light receiving device according to an embodiment of the present invention.

Referring to FIG. 1, a phototransistor 20 is configured so that a planer N type semiconductor substrate has an N+ type collector layer 2 and an N type collector layer 3 laminated on the N+ type collector layer 2. An N+ type channel stopper layer 13 is embedded at an outer periphery (along a surrounding edge) of the N type collector layer 3, where the N+ type channel stopper layer 13 is exposed from an outer peripheral surface of the N type collector layer 3. A P type base layer 4 having a predetermined thickness is embedded in a middle portion of the N type collector layer 3 surrounded by the N+ type channel stopper layer 13, where there is a predetermined space between the P type base layer 4 and the N+ type channel stopper layer 13 and the P type base layer 4 is exposed from a surface of the N type collector layer 3. A surface of the P type base layer 4 receives incident light. An N+ type emitter layer 5 having a predetermined thickness is embedded in the vicinity of an edge of the P type base layer 4, where the N+ type emitter layer 5 is exposed from a surface of the P type base layer 4.

An emitter underlying electrode 7 is provided on a middle portion of the N+ type emitter layer 5. An oxide insulating film 6 is provided around the emitter underlying electrode 7, where the oxide insulating film 6 covers surfaces of the N type collector layer 3, the P type base layer 4, the N+ type emitter layer 5, and the N+ type channel stopper layer 13. An emitter electrode 12 is provided on the emitter underlying electrode 7 and the oxide insulating film 6, where the emitter electrode 12 faces the N+ type emitter layer 5.

A metal guard ring line 9 (second metal line) is provided on the oxide insulating film 6 along each inner edge portion of regions in which the N+ type channel stopper layer 13 is embedded, where the metal guard ring line 9 is electrically connected to the emitter electrode 12. Further, a plurality of metal shield lines 8 (first metal lines) are provided on the oxide insulating film 6 covering the surface of the P type base layer 4, where the metal shield lines 8 are electrically connected to the emitter electrode 12 (in FIG. 1, the connections between the emitter electrode 12, and the metal shield line 8 and the metal guard ring line 9 are not shown). The metal shield line 8 and the metal guard ring line 9 have a triangle-shaped section such that a pair of sloped sides thereof become narrower toward above. Note that the section of the metal shield line 8 and the metal guard ring line 9 may be in the shape of a trapezoid where the top side is flat.

The metal shield line 8 and the metal guard ring line 9 are covered with a line protection film 10 whose surface is made of oxide film or the like. The entire surfaces of the line protection film 10 and the oxide insulating film 6 are covered with a polyimide film 11, excluding the emitter electrode 12. A collector electrode 1 is provided on a surface of the N+ type collector layer 2.

The phototransistor 20 of FIG. 1 is thus provided with an NPN transistor comprising the N+ type collector layer 2 and the N type collector layer 3, the P type base layer 4, and the N+ type emitter layer 5, which serve as collectors (C), a base (B), and an emitter (E), respectively; and a photodiode having a PN junction at the interface between the P type base layer 4 and the N type collector layer 3 where the N+ type collector layer 2 and the N type collector layer 3 serve as cathodes and the P type base layer 4 serves as an anode.

The emitter electrode regions (the emitter underlying electrode 7 and the emitter electrode 12), the metal shield line 8 and the metal guard ring line 9 are made of Al mixed with Ag or Cu. Ag and Cu have a high level of electric conductivity, thermal conductivity, and the like, compared to Al. Ag and Cu are also highly ductile and malleable, thus easily made into a thin line. In particular, Cu has an electric conductivity 1.6 times greater than the electric conductivity of Al and is less expensive compared to Ag. Thus, Cu is suitable as a material to be mixed with Al for production of a line. If Cu mixed with Al is used as a material for the metal shield line 8 and the metal guard ring line 9, then for the emitter electrode region, the lower emitter underlying electrode 7 is made of Cu while the upper emitter electrode 12 is made of Al.

It is now assumed that the upper emitter electrode 12 of the emitter electrode region is made of Cu. Since Cu is readily oxidized as compared to Al and Ag, an oxide film is formed on the surface of the emitter electrode 12 of Cu, which makes it difficult to weld (e.g., wire bonding) a metal wire (mainly made of Au or Au alloy) to the surface of Cu (the emitter electrode 12. In this case, connection to external circuitry is unstable. To avoid this, the emitter underlying electrode 7 is made of Cu while the emitter electrode 12 is made of Al, thereby making it possible to obtain stable connection to external circuitry. Note that the base electrode region and the emitter electrode region are formed into a similar structure (not shown).

When the metal shield line 8 and the metal guard ring line 9 are made of Al mixed with Cu, the line protection film 10 prevents Cu atoms having a high level of ability to diffuse from diffusing into regions other than the metal shield line 8 and the metal guard ring line 9. In addition, it is possible to prevent the degradation over time in noise resistance due to progression of oxidation of the metal shield line 8 and the metal guard ring line 9. The line protection film 10 is made of a Cu oxide film which is purposely formed on the metal shield line 8 and the metal guard ring line 9 by thermal treatment or the like. Note that the line protection film 10 may be made of a stable metal layer of Al or the like formed on the surface of the metal shield line 8 and the metal guard ring line 9 instead of oxide film. In this case, an effect similar to that of oxide film can be obtained.

Figure 2:
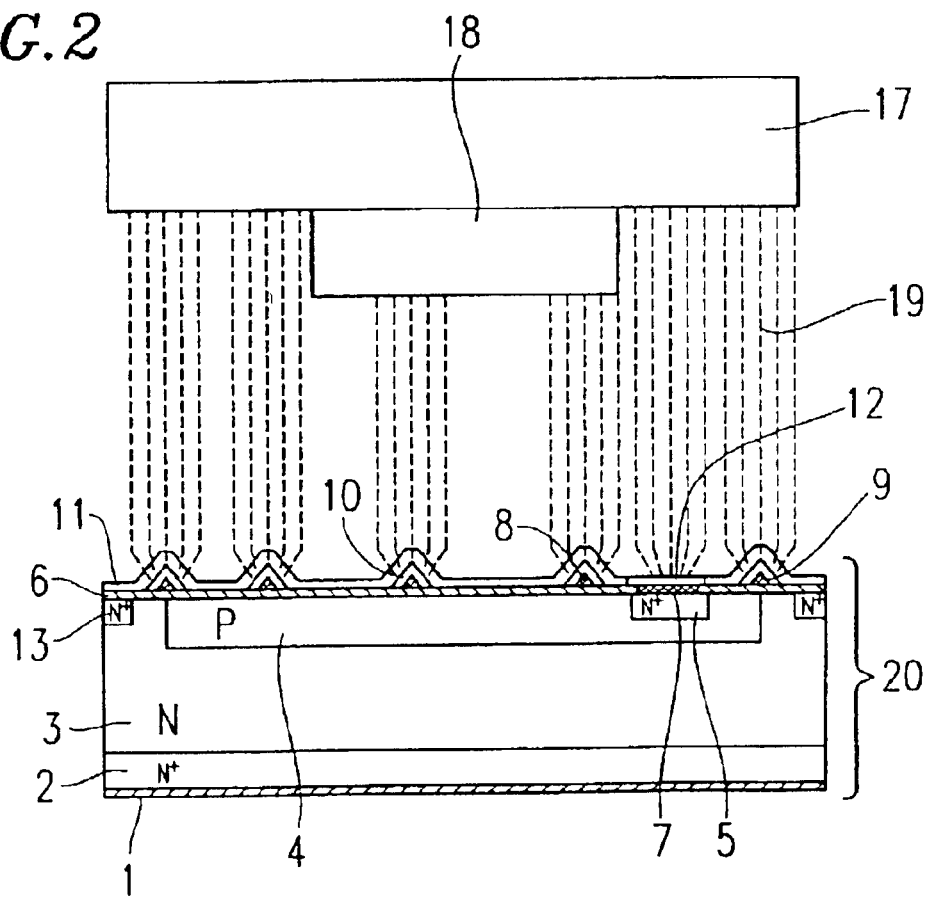
FIG. 2 is a cross-sectional view showing a photocoupler incorporating the phototransistor of FIG. 1.

FIG. 2 is a cross-sectional view showing that the phototransistor 20 is disposed opposing a photocoupler in which a light emitting element 18, such as an LED or the like, is provided on a substrate 17 (a lead frame may be used instead of the substrate).

The phototransistor 20 generates electric lines of force 19 which are directed from the emitter electrode 12, and the metal shield line 8 and the metal guard ring line 9, which are electrically connected to the emitter electrode 12 so that they have the same potential as that of the emitter electrode 12, to the light emitting element 18 of the photocoupler. The electric line of force 19 functions as a shield for protecting the P type base layer 4 from electromagnetic noise caused when a steeply changing pulse voltage is applied between the light emitting element 18 and the phototransistor 20. The electromagnetic noise causes a noise current in the emitter electrode 12, the metal shield line 8 and the metal guard ring line 9. However, the noise current is caused to flow out of the phototransistor 20 quickly. Incident light coming from above the metal shield line 8 and the metal guard ring line 9 is reflected by the sloped surfaces of the metal shield line 8 and the metal guard ring line 9 have a triangle-shaped section such that a pair of sloped sides thereof become narrower toward above. This structure allows the reflected light to enter the P type base layer 4 (light receiving region) and to be then converted into a photocurrent. As a result, a predetermined amount of light can be received by the P type base layer 4 (light receiving region). Note that the sloped surfaces of the metal shield line 8 and the metal guard ring line 9 each have a predetermined angle with respect to the oxide insulating film 6.

As described above, the phototransistor 20 of the present invention shown in FIG. 1 is provided with the metal shield line 8 having the same potential as that of the emitter electrode, which is provided on the oxide insulating film 6 at a position corresponding to the P type base layer 4, and the metal guard ring line 9 having the same potential as that of the emitter electrode, which is provided on the oxide insulating film 6 at a position corresponding to the PN junction region between the P type base layer 4 and the N type collector layer 3. The metal shield line 8 and the metal guard ring line 9 are formed so that the section thereof is in the shape of a triangle having sloped sides having a predetermined angle with respect to the oxide insulating film 6. Therefore, even when the number of metal shield lines 8 is increased in order to improve the CMR characteristic, however, the light receiving area is reduced relative to the light receiving region (the P type base layer 4), the reduction of the amount of received light can be suppressed as much as possible without affecting the function of the phototransistor 20.

Therefore, even when the phototransistor 20 of the present invention is incorporated in a photocoupler, it is possible to suppress the occurrence of a noise current in the P type base layer 4, which is the base (B) of the phototransistor 20, via the stray capacitance Cf between the light emitting element 18 of the photocoupler and the phototransistor 20. Thereby, the CMR characteristic is improved and a predetermined amount of light can be received in the P type base layer 4, i.e., the performance of the photocoupler can be improved.

Figure 3:
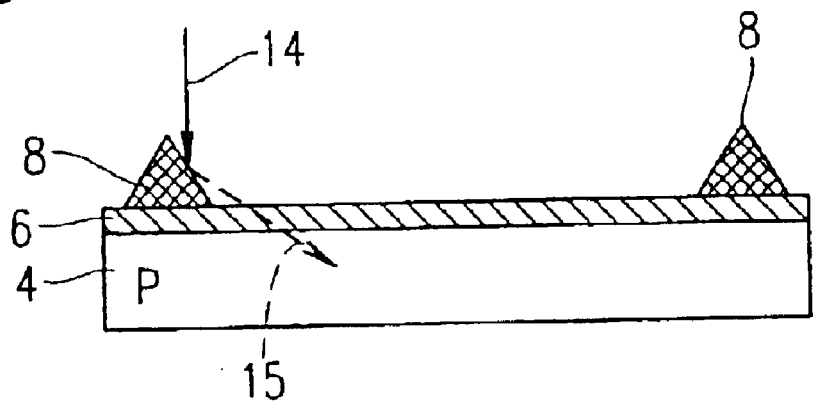
FIG. 3 is a cross-sectional view showing metal shield lines provided in the phototransistor of FIG. 1.
Figure 4:
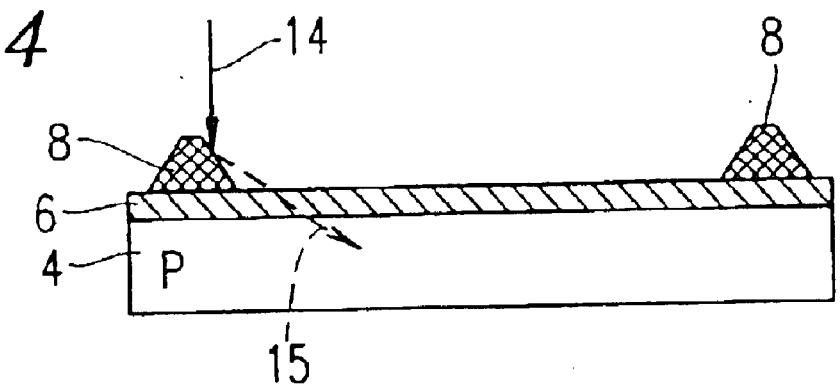
FIG. 4 is a cross-sectional view showing another set of metal shield lines provided in the phototransistor of FIG. 1.
Figure 5:
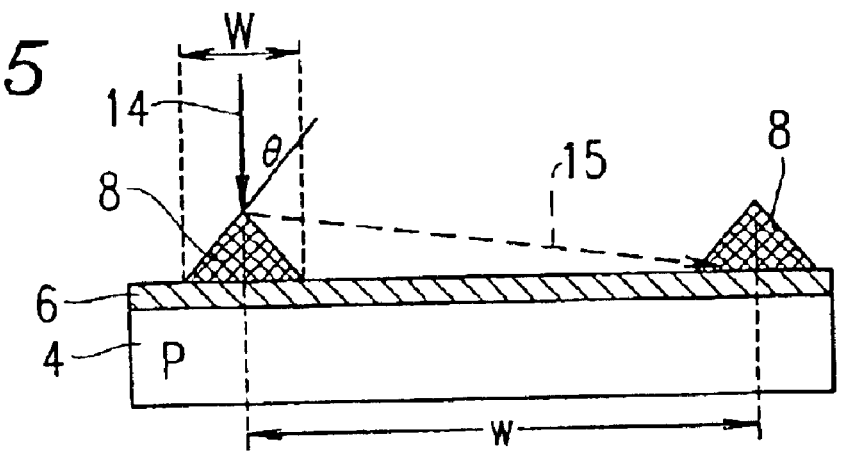
FIG. 5 is a cross-sectional view of metal shield lines for explaining the relationship between the angle of the sloped surface of the metal shield line and the line ratio.

FIGS. 3 to 5 are enlarged, cross-sectional views showing a plurality of metal shield lines 8 and their vicinity in the phototransistor 20 of FIG. 1. Referring to FIGS. 3 and 4, the metal shield line 8 is formed into a triangle having sloped sides having a predetermined angle with respect to the oxide insulating film 6. Incident light 14 falls on the sloped side of the metal shield line 8 having a predetermined angle with respect to the oxide insulating film 6. The angle of the sloped surface is set to be more than 45° with respect to the surface of the oxide insulating film 6 (i.e., the surface of the P type base layer 4). By setting the angle of the sloped surface in such a manner, the incident angle of the incident light 14 falling on the metal shield line 8 with respect to the sloped surface is smaller than 90°. Therefore, the reflected light 15 is reflected toward the P type base layer 4 (i.e., downward), but not upward.

Thus, the incident light 14 coming from above the sloped surface of the metal shield line 8 is substantially totally reflected by the sloped surface of the metal shield line 8. The entire incident light 14 falls as the reflected light 15 on the P type base layer 4 (light receiving region). In other words, substantially no part of the incident light 14 is reflected upward. Accordingly, even when the number of metal shield lines 8 is increased in order to improve the CMR characteristic, the light receiving area of the incident light 14 in the light receiving region of the phototransistor 20 is not largely reduced, so that a predetermined amount of received light can be obtained.

The example of FIGS. 3 and 4 will be described in more detail with reference to FIG. 5. As shown in FIG. 5, the width of the metal shield line 8 is represented by W, the distance between adjacent metal shield lines 8 is represented by w which is required for the reflected light 15 of one metal shield line 8 not to be absorbed by its adjacent metal shield line 8, the angle of the sloped surface of the metal shield line 8 with respect to the P type base layer 4 is represented by $\theta$. In this case, the relationship between the above-described variables is represented by $w/W = (1 - \tan\theta \tan 2\theta)/2$. According to this relational expression, the ratio (w/W) of the distance w between adjacent metal shield lines 8 to the width W of the metal shield line 8 is determined by the angle $\theta$ of the sloped surface of the metal shield line 8 with respect to the P type base layer 4 (such w/W is hereinafter referred to as the line ratio w/W).

Figure 6:
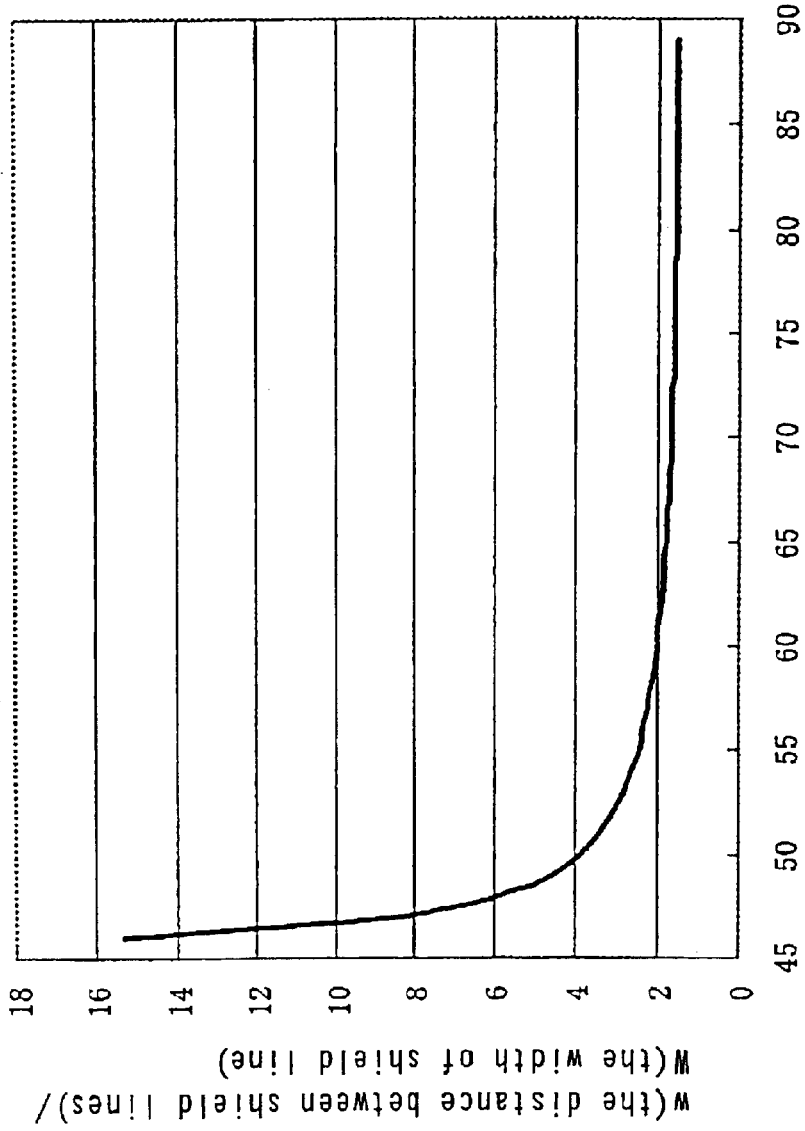
FIG. 6 is a graph showing the relationship between the angle of the sloped surface of the metal shield line and the line ratio.

FIG. 6 is a graph showing a change in the ratio (w/W) of the distance w between adjacent metal shield lines 8 to the width W of the metal shield line 8 with the angle θ of the sloped surface of the metal shield line 8 with respect to the P type base layer 4.

According to the graph of FIG. 6, when the angle θ of the sloped surface of the metal shield line 8 with respect to the P type base layer 4 is 45°<θ<55°, the angle θ is steeply changed with relative to the line ratio w/W. In this case, there may be large variations in reflection property among the metal shield lines 8 with respect to the incident light 14. When the angle θ of the sloped surface of the metal shield line 8 with respect to the P type base layer 4 is 55°≦θ, the line ratio w/W≅2. In this case, the angle θ is not much affected by the line ratio w/W, so that the reflection property of the metal shield line 8 is stable with respect to the incident light 14. Thus, the metal shield line 8 or the line protection film 10 is produced by adjusting the angle θ of the sloped surface of the metal shield line 8 with respect to the P type base layer 4, the distance w between adjacent metal shield lines 8, and the width W of the metal shield line 8 under the process conditions such that the angle θ is large as much as possible while the line ratio w/W is kept small. An optimal value may be determined. As a result, a number of metal shield lines 8 can be provided on the oxide insulating film 6 covering the P type base layer 4 (light receiving region), whereby a high-performance phototransistor 20 can be obtained such that the CMR characteristic can be improved while a predetermined amount of received light is secured.

Figure 7A:
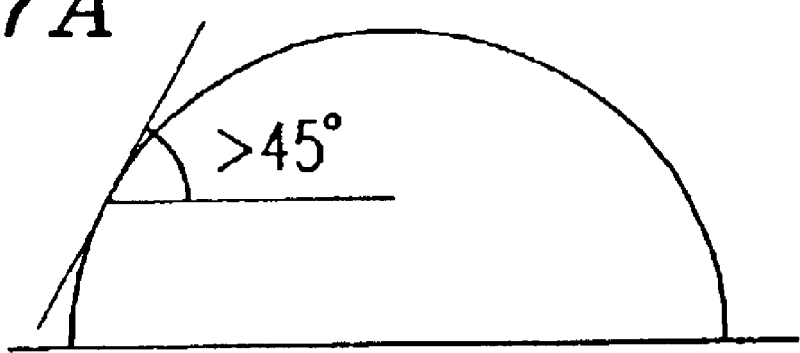
FIGS. 7A and 7B are cross-sectional views showing other exemplary metal shield lines other than the examples of FIGS. 3 and 4.
Figure 7B:
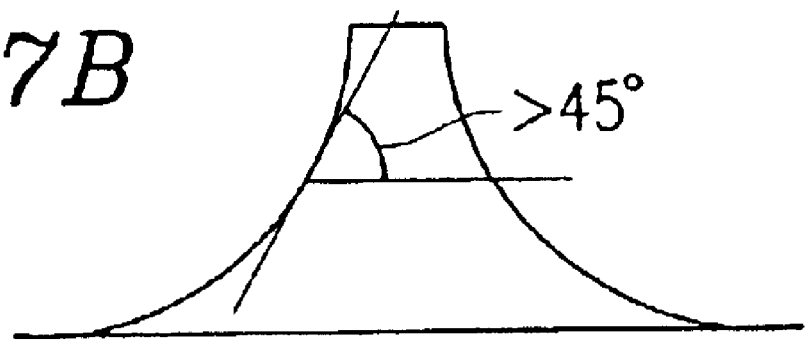

FIGS. 7A and 7B are cross-sectional views showing other exemplary metal shield lines 8 having a section in a shape having a pair of sloped sides which become narrower upward, other than a triangle and a trapezoid. The metal shield line 8 shown in FIG. 7A is in the shape of a semicircle where the sloped sides of the metal shield line 8 of FIG. 3 curve upward. The metal shield line 8 shown in FIG. 7B is in a shape such that the sloped sides of the metal shield line 8 of FIG. 4 curve downward. The curved sloped surfaces of FIGS. 7A and 7B both have any curvature. The curved sloped surface has a region whose tangent has a gradient (angle) of more than 45°. Therefore, an effect similar to that of the metal shield line 8 of FIGS. 3 and 4 can be obtained.

Figure 8A:
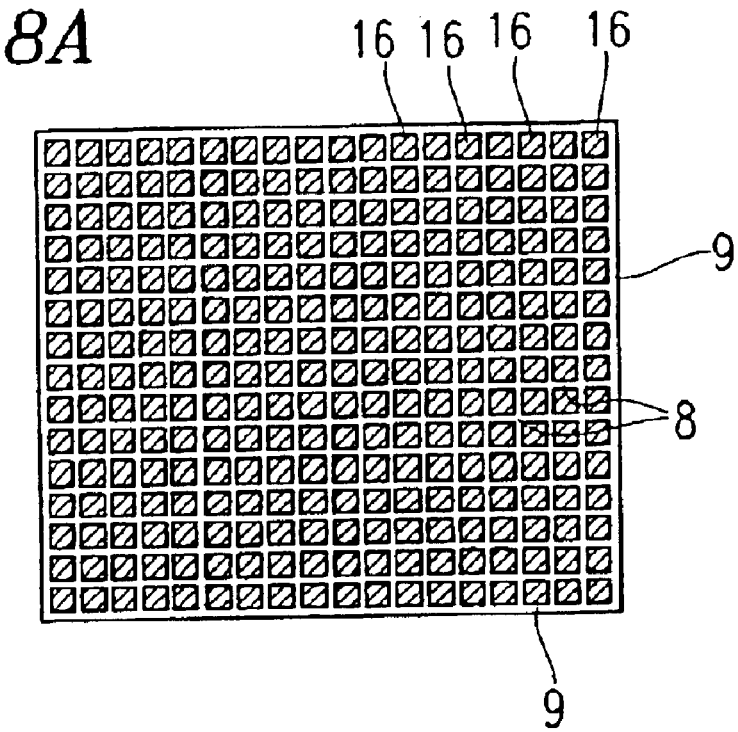
FIG. 8A is a diagram showing an exemplary line pattern of metal shield lines and a metal guard ring line of a phototransistor of the present invention.
Figure 8B:
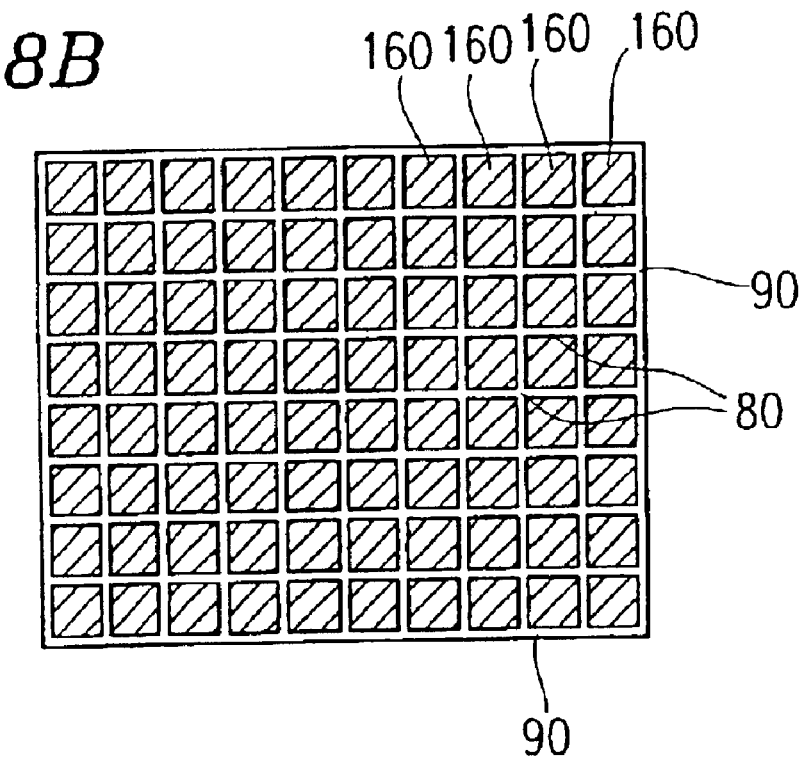
FIG. 8B is a diagram showing an exemplary line pattern of metal shield lines and a metal guard ring line of a conventional phototransistor.
Figure 9:
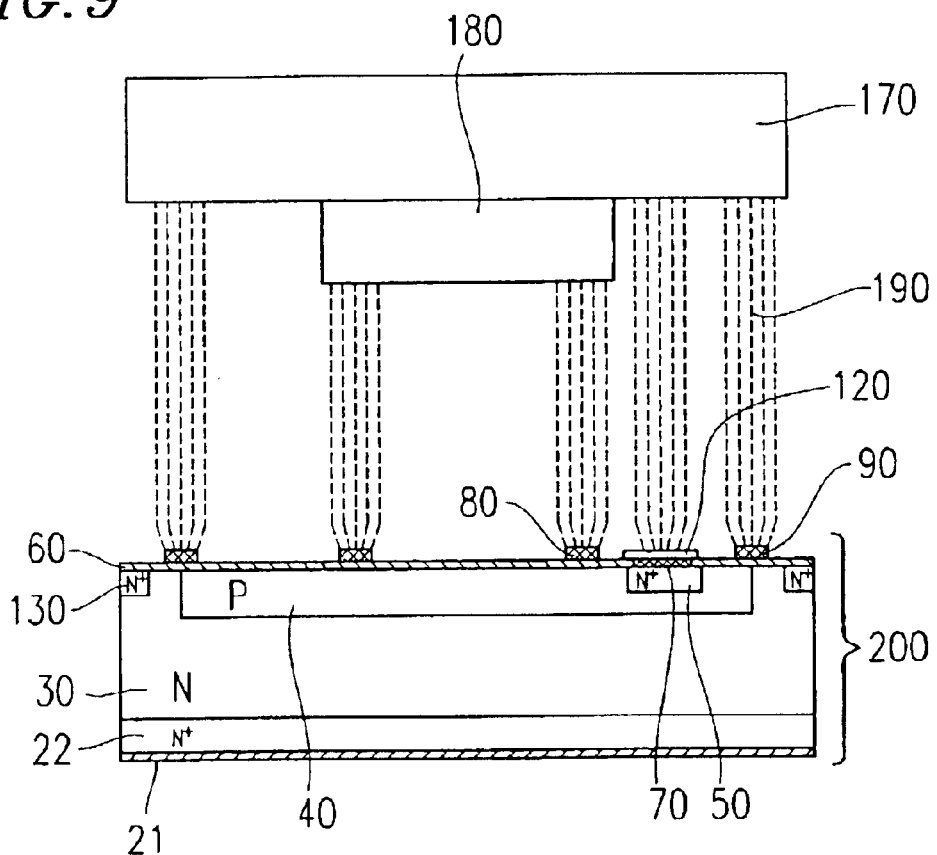
FIG. 9 is a cross-sectional view showing a photocoupler incorporating a conventional phototransistor.
Figure 10:
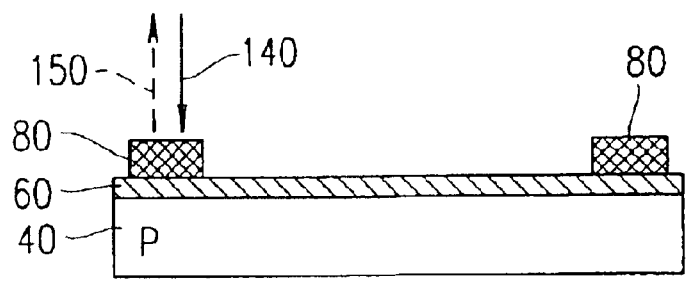
FIG. 10 is a cross-sectional view showing metal shield lines provided in a conventional phototransistor.

FIG. 8A is a diagram showing an exemplary line pattern of the metal shield line 8 and the metal guard ring line 9 of the phototransistor 20 of the present invention (FIG. 1). FIG. 8B is a diagram showing an exemplary line pattern of the metal shield line 80 and the metal guard ring line 90 of the conventional phototransistor 200 (FIG. 9).

In the line pattern of FIG. 8A, the material and the line ratio w/W of the metal shield line 8 are optimized so that the width of the metal shield line 8 is small. Therefore, a number of metal shield lines 8 are provided in fine mesh within the light receiving region (on the P type base layer 4) surrounded by the metal guard ring line 9 and a number of surfaces 16 to be exposed to incident light are provided and surrounded by the metal shield lines 8. Therefore, a high-performance phototransistor 20 can be obtained such that the CMR characteristic is improved and a predetermined amount of received light is secured.

In contrast, the material and the line ratio w/W of the metal shield line 80 are not optimized in the line pattern of FIG. 8B. A plurality of metal shield lines 80 are provided in coarse mesh within the light receiving region (on the P type base layer 40) surrounded by the guard ring line 90. A plurality of surfaces 160 to be exposed to incident light are provided and surrounded by the metal shield lines 80. Therefore, the phototransistor 200 cannot obtain the CMR characteristic equal to or better than that of the phototransistor 20.

The total area of the exposed surfaces 16 of FIG. 8A is smaller than the total area of the exposed surface 160 of FIG. 8B when the width of the metal shield line 8 is the same as the width of the metal shield line 80. Even in such a case, there is substantially no difference in the amount of received light therebetween, resulting in no influence on the characteristics of the phototransistor 20.

The above-described phototransistor 20, which is the semiconductor light receiving device of the present invention, may be used in electronic apparatus, such as power source apparatus, communication apparatus, and the like, to prevent malfunctions due to electromagnetic noise. The phototransistor 20 may be incorporated in a particular photocoupler which is provided at a communication interface portion between apparatuses having different operating voltages on a field bus network between FA apparatuses, such as programmable controllers requiring a high-speed respoonse.

The semiconductor light emitting device of the present invention comprises a base region, a collector region, and an emitter region. A second metal line, which has the same potential as that of an emitter region, is provided on the junction portion of the base region and the collector region, surrounding the base region (light receiving region). A plurality of first metal lines, which have the same potential as that of the emitter region, is provided on the base region via an insulating film. The first metal line has a sloped surface on which incident light is reflected and directed toward the surface of the base region (light receiving region). As a result, the CMR characteristic can be improved without reducing the amount of received light.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light receiving device, comprising:
   a semiconductor substrate;
   a collector region on the semiconductor substrate;
   a base region embedded in the collector region and exposed from a surface of the collector region, wherein the base region serves as a light receiving region;
   an emitter region embedded in the base region and exposed from a surface of the base region;
   an insulating film covering the surface of the collector region, the base region, and the emitter region;
   a first metal line on the insulating film at a position corresponding to the base region; and
   a second metal line on the insulating film at a position corresponding to a junction portion of the base region and the collector region,
   wherein the first metal line has a sloped surface such that incident light falling on the first metal line is reflected and directed toward the surface of the base region.

2. A semiconductor light receiving device according to claim 1, wherein the sloped surface of the first metal line is sloped at an angle of more than 45° and less than 90° with respect to the surface of the base region.

3. A semiconductor light receiving device according to claim 1, wherein the first metal line and the second metal line are made of Al and Cu.

4. A semiconductor light receiving device according to claim 3, wherein the emitter region and the base region each have an electrode portion having a laminate structure comprising an upper layer of Al and a lower layer of Cu.

5. A semiconductor light receiving device according to claim 1, wherein the first metal line and the second metal line are made of Al and Ag.

6. A semiconductor light receiving device according to claim 1, wherein the sloped surface of the first metal line is covered with a protection film.

7. A semiconductor light receiving device according to claim 6, wherein the protection film is made of an oxide film.

8. A semiconductor light receiving device according to claim 1, wherein the first metal lines are arranged in mesh.

9. An electronic apparatus, comprising a semiconductor light receiving device according to claim 1.

10. A semiconductor light receiving device comprising:
   a semiconductor substrate;
   a collector region on the semiconductor substrate;
   a base region embedded in the collector region and exposed from a surface of the collector region, wherein the base region serves as a light receiving region;
   an emitter region embedded in the base region and exposed from a surface of the base region;
   an insulating film covering the surface of the collector region, the base region, and the emitter region;
   a first metal line on the insulating film at a position corresponding to the base region; and
   a second metal line on the insulating film at a position corresponding to a junction portion of the base region and the collector region,
   wherein the first metal line has a sloped surface such that incident light falling on the first metal line is reflected and directed toward the surface of the base region and is covered with a protection film,
   wherein the protection film is made of a metal film.

11. A semiconductor light receiving device according to claim 10, wherein the metal film is made of Al.

* * * * *